United States Patent [19]

Okamoto

[11] Patent Number: 5,739,706
[45] Date of Patent: Apr. 14, 1998

[54] MAGNETICALLY RECORDING APPARATUS

[75] Inventor: Yujiro Okamoto, Kyoto, Japan

[73] Assignee: Rohm Co., Ltd., Kyoto, Japan

[21] Appl. No.: 808,807

[22] Filed: Feb. 28, 1997

Related U.S. Application Data

[63] Continuation of Ser. No. 444,879, May 19, 1995, abandoned.

[30] Foreign Application Priority Data

May 20, 1994 [JP] Japan .................. 6-106833

[51] Int. Cl.$^6$ ........................................ H03K 3/53
[52] U.S. Cl. ................... 327/110; 327/365; 327/309;
327/320; 327/310; 360/46
[58] Field of Search ......................... 327/50, 52, 84,
327/92, 306, 309, 310, 311, 314, 317, 110,
112, 111, 379, 365, 584, 320, 321; 360/46,
67

[56] References Cited

U.S. PATENT DOCUMENTS

| | | | |
|---|---|---|---|
| 3,365,617 | 1/1968 | Flanagan | 322/584 |
| 3,573,774 | 4/1971 | Olsen | 322/314 |
| 3,763,383 | 10/1973 | Johnson | 322/110 |
| 4,255,724 | 3/1981 | Bergero | 322/314 |
| 5,426,537 | 6/1995 | Yeh et al. | 360/46 |

OTHER PUBLICATIONS

IBM Technical Disclosure Bulletin, vol. 30, No. 4 Sep. 1987.

Primary Examiner—Timothy P. Callahan
Assistant Examiner—Dinh T. Le
Attorney, Agent, or Firm—Nikaido Marmelstein Murray & Oram LLP

[57] ABSTRACT

A terminating circuit including a pair of diodes connected to have polarities opposite to each other is provided across a magnetic head. When the potential difference across the magnetic head is drastically changed to be equal to or higher than the breakdown voltage of the diodes at the time of switching of a writing current, either one of the diodes breaks down, so that a part of the writing current flows out through the terminating circuit. As a result, ringing due to the drastic change is removed. When the potential difference across the magnetic head is lower than the breakdown voltage of the diodes, since either one of the diodes is reversely biased, the resistance of the terminating circuit is maintained high. Consequently, within this range, the writing current flowing to the magnetic head never flows out to the terminating circuit. As a result, the deterioration of the reading and writing characteristics is prevented.

2 Claims, 9 Drawing Sheets

5,739,706

MAGNETICALLY RECORDING APPARATUS

This application is a continuation of application Ser. No. 08/444,879 filed May 19, 1995 and now abandoned.

BACKGROUND OF THE INVENTION

1. Field of the Invention

The present invention relates to an improvement of a magnetically recording apparatus used for a floppy disk apparatus and a video tape recorder.

2. Description of the Prior Art

FIG. 1 shows a typical conventional art. At terminals 2 and 3 of a magnetic head 1, a differential circuit 4 is provided for supplying a writing current to the magnetic head 1. The differential circuit 4 includes a first NPN-type transistor 5 and a second NPN-type transistor 6. The collectors of the transistors 5 and 6 are connected to the terminals 2 and 3, respectively, and to the emitters thereof, a constant current source 7 is connected. To the bases of the transistors 5 and 6, gates 8a and 8b for receiving write signals are connected, respectively. To the terminals 2 and 3, a reading out circuit 9 is connected which reads out recording signals through the magnetic head 1. The magnetic head 1 is supplied with the supply voltage.

Between the terminals 2 and 3, a damping resistor 10 is provided which reduces subsequently-described ringing. Now, an operation of the damping resistor 10 will be described. FIG. 2 shows waveform charts of assistance in explaining the operation of the damping resistor 10.

(1) of FIG. 2 shows a write signal A supplied to the base of the transistor 5 through the gate 8a. The write signal A is inverted at the gate 8b to obtain a write signal B shown at (2) of FIG. 2. The write signal B is supplied to the base of the transistor 6.

For example, at a time t0, the level of the write signal A is high and the level of the write signal B is low, so that the first transistor 5 is maintained activated and the second transistor 6 is maintained disabled. Consequently, a writing current flowing in the direction of arrow a (see FIG. 1) flows to the magnetic head 1.

At a time t1, the level of the write signal A is changed from high to low and the level of the write signal B is changed from low to high, so that the state of the first transistor 5 is changed from activated state to disabled state and the state of the second transistor 6 is changed from disabled state to activated state. At this time, the current flowing in the direction of arrow a at the magnetic head 1 flows in the direction of arrow b, so that as shown at (3) of FIG. 2, the potential of the terminal 2 is maintained substantially constant after a so-called counter electromotive force V1 is instantaneously generated.

At a time t2, the level of the write signal A is changed from low to high and the level of the write signal B is changed from high to low, so that the state of the second transistor 6 is changed from activated state to disabled state and the state of the first transistor 5 is changed from disabled state to activated state. At this time, the current flowing in the direction of arrow b at the magnetic head 1 flows in the direction of arrow a, so that as shown at (4) of FIG. 2, the potential of the terminal 3 is maintained substantially constant after a counter electromotive force V2 is instantaneously generated.

The magnetic head 1 is supplied with a writing current shown at (5) of FIG. 2.

At the timings (times t1, t2, . . . ) of switching of the differential circuit 4, an oscillation caused at the rises of waveforms due to transient phenomena of the counter electromotive force, i.e. ringing shown by R1 and R2 at (3) and (4) of FIG. 2 occurs. As shown at (5) of FIG. 2, such ringing affects the waveform of the writing current flowing to the magnetic head 1, so that characteristic deterioration may occur in writing.

Such ringing can be absorbed by the damping resistor 10 to some extent. That is, when the ringing occurs, a part of the writing current flowing to the magnetic head 1 flows to the differential circuit 4 through the damping resistor 10, so that the ringing can be absorbed.

For example, at the time t2, the current flowing to the magnetic head 1 in the direction of arrow a starts to flow in the direction of arrow b. A part of the current flowing in the direction of arrow a flows to the terminal 3 through the damping resistor 10, so that ringing due to the counter electromotive force V2 generated at the terminal 3 can be absorbed to some extent. Further, even if an undesired voltage is generated at the terminals 2 and 3 under a condition where the terminals 2 and 3 are maintained at a constant voltage after a counter electromotive force is generated there, the undesired voltage can be absorbed since a leakage current flows through the damping resistor 10.

However, since the conventional damping resistor 10 has a comparatively high resistance of approximately 4 kΩ, the leakage current flowing to the damping resistor 10 is small, so that it is impossible to sufficiently absorb the ringing. To solve this problem, it is considered to reduce the resistance of the damping resistor 10.

FIG. 3 graphically shows relationships between a voltage between the terminals 2 and 3 (hereinafter, this voltage will be referred to as terminal voltage) and the leakage current flowing to the damping resistor 10. The relationship of the case where the conventional damping resistor 10 having a high resistance is used is shown by a line L1 of FIG. 3. The relationship of the case where the resistance of the damping resistor 10 is reduced (specifically, reduced to 2 kΩ which is half the conventional resistance) is shown by a line L2 of FIG. 3. As is apparent from FIG. 3, by reducing the resistance of the damping resistor 10, the amount of the leakage current of the undesired current flowing to the magnetic head 1 which leakage current flows to the damping 10 increases, so that the ringing can be removed.

However, when the resistance of the damping resistor is reduced, although the ringing can be removed, the switching of the writing current is delayed, so that the writing characteristic deteriorates.

(6) and (7) of FIG. 2 are waveform charts of assistance in explaining a writing operation performed when a damping resistor having a low resistance is used. (6) of FIG. 2 shows a potential of the terminal 3, and (7) of FIG. 2 shows a writing current flowing to the magnetic head 1.

In this case, although the ringing due to the counter electromotive force is removed as shown at (6) of FIG. 2, the fall (rise) of the counter electromotive force is delayed and the rise (fall) of the writing current is delayed as shown at (7) of FIG. 2. The reason why the switching of the writing current is delayed is that since the resistance of the damping resistor 10 is low, the writing current which should flow to the magnetic head 1 flows out to the terminal 2 or 3 through the damping resistor 10.

Thus, when the resistance of the damping resistor 10 is low, although the ringing is removed, the switching of the current is delayed, so that the writing characteristic deteriorates. Further, in this case, the resistance of the damping resistor 10 is not ignorable for the impedance of the magnetic head 1, so that the reading characteristic deteriorates such that the reproduction output (potential difference between the terminals 2 and 3) in reading out decreases.

On the other hand, when the resistance of the damping resistor 10 is increased, the amount of the current flowing to the damping resistor decreases as described above, so that the ringing cannot sufficiently be removed.

SUMMARY OF THE INVENTION

An object of the present invention is to provide a magnetically recording apparatus capable of preventing the deterioration of the writing and reading characteristics and of preventing the generation of ringing during writing.

To achieve the above-mentioned object, a magnetically recording apparatus of the present invention is provided with means for connecting a center of a magnetic head to a constant potential, differential connected transistors whose control electrodes are supplied with a writing signal, means for connecting output electrodes of the differential connected transistors across the magnetic head, and a terminating circuit including a pair of PN junctions connected across the magnetic head to have polarities opposite to each other. The terminating circuit is activated when a voltage difference across the magnetic head becomes a predetermined level or above at a time of writing.

According to the present invention, since the terminating circuit including a pair of PN-junctions connected to have polarities opposite to each other is provided across the magnetic head, when the potential difference across the magnetic head is lower than a voltage at which the PN-junctions break down, either one of the PN-junctions is reversely biased, so that the resistance of the terminating circuit is maintained high. As a result, within this range, the deterioration of the reading and writing characteristics is prevented without the writing current flowing to the magnetic head being flowed out to the terminating circuit.

On the other hand, when the potential difference across the magnetic head is drastically changed to be equal to or higher than a voltage at which the PN-junctions break down at the time of switching of the writing current, either one of the PN-junctions breaks down, so that a part of the writing current flows out through the terminating circuit. As a result, ringing due to the drastic change is removed.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
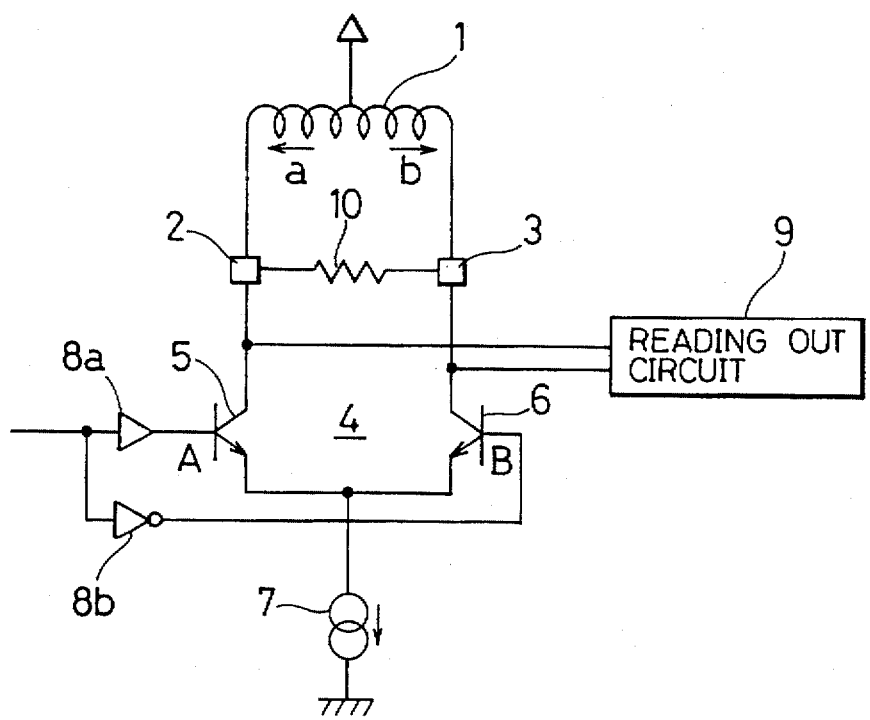
FIG. 1 is a circuit diagram showing a typical conventional magnetically recording apparatus.
Figure 2:
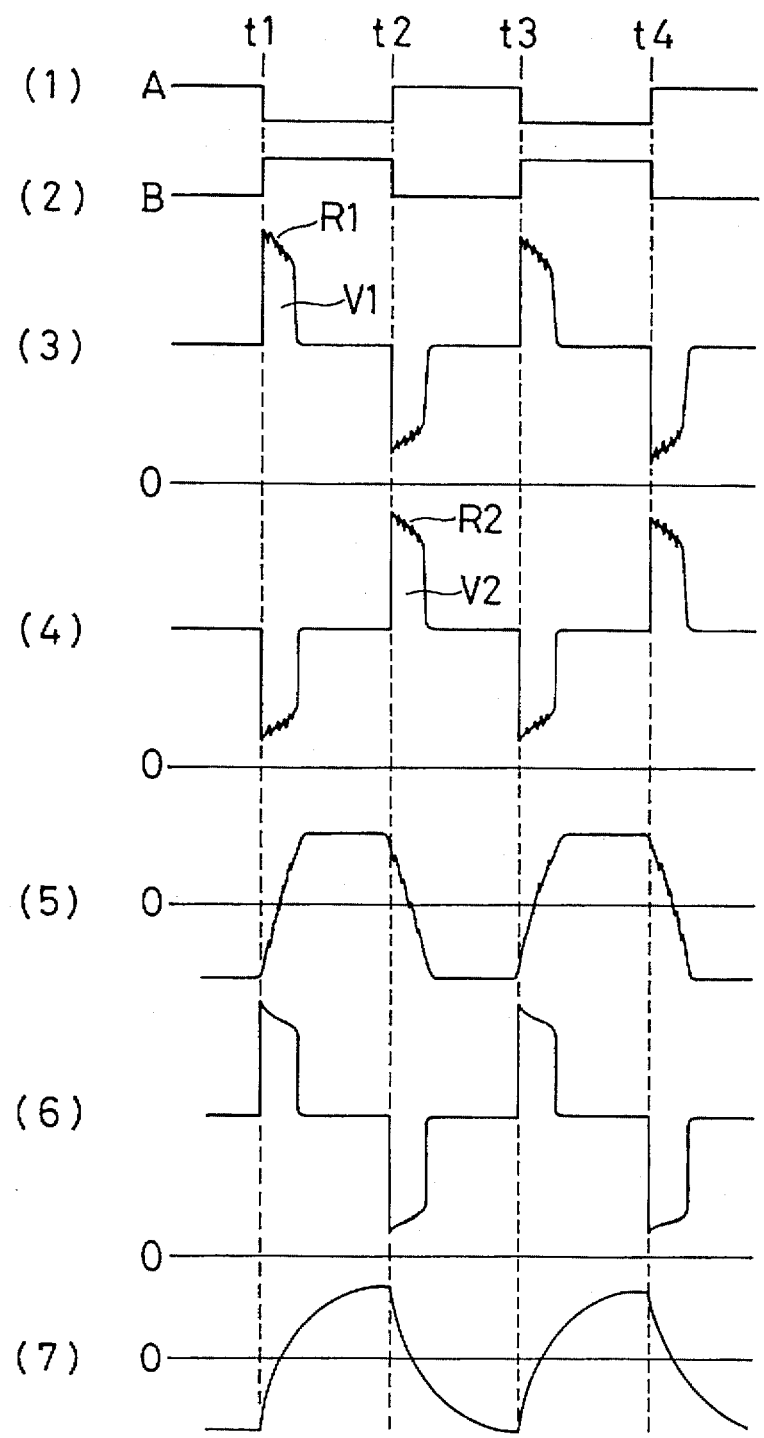
FIGS. 2 (1)–(7) show waveform charts of assistance in explaining an operation of the conventional apparatus.
Figure 3:
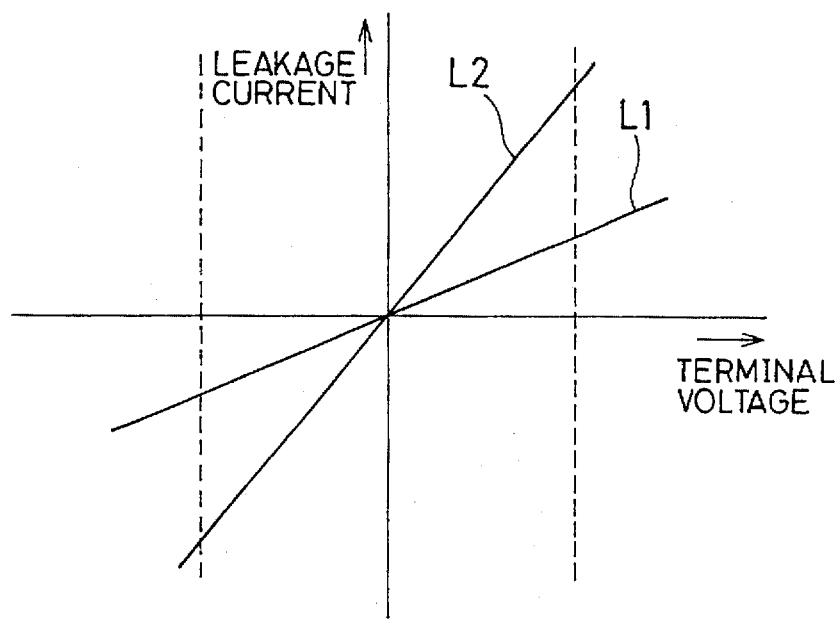
FIG. 3 graphically shows relationships with a leakage current flowing to the damping resistor.
Figure 4:
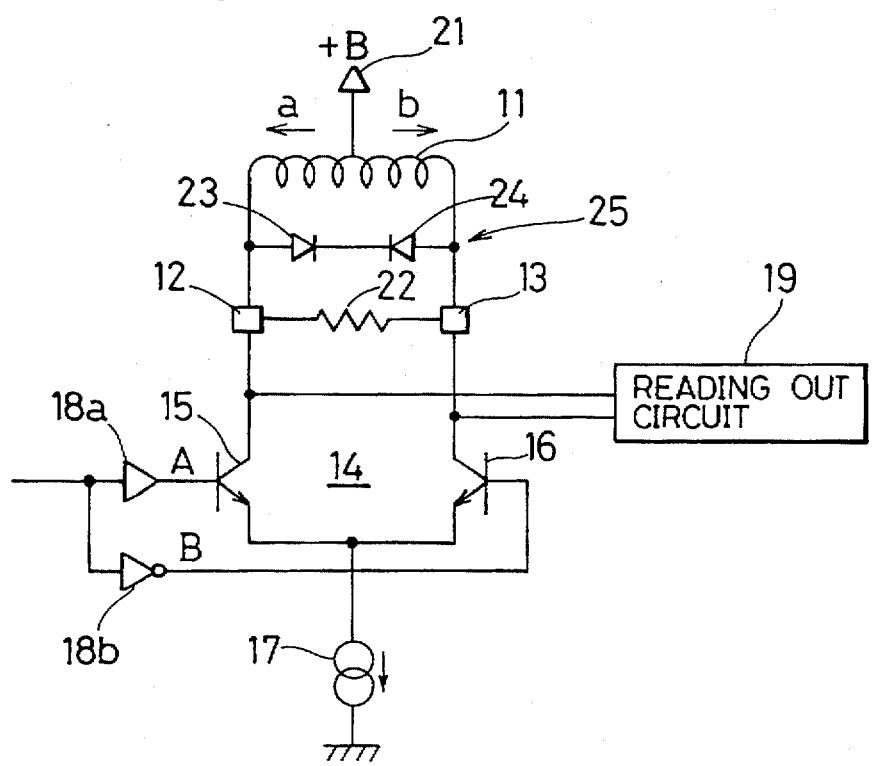
FIG. 4 is a circuit diagram showing the arrangement of a magnetically recording apparatus of an embodiment of the present invention.

FIG. 4 is a circuit diagram showing the arrangement of a magnetically recording apparatus of an embodiment of the present invention. At terminals 12 and 13 of a magnetic head 11, a differential circuit (amplifier circuit) 14 is provided for supplying a writing current to the magnetic head 11. The differential circuit 14 includes a first NPN-type transistor 15 and a second NPN-type transistor 16. The collectors of the transistors 15 and 16 are connected to the terminals 12 and 13, respectively, and to the emitters thereof, a constant current source 17 is connected. To the bases of the transistors 15 and 16, gates 18a and 18b for receiving write signals are connected. To the terminals 12 and 13, a reading out circuit 19 for reading out recorded signals through the magnetic head 11 is connected. The magnetic head 11 is supplied with a supply voltage +B through a terminal 21.

Between the terminals 12 and 13, a damping resistor 22 is provided which reduces the ringing of the writing current. The damping resistor 22 has a comparatively high resistance, e.g. approximately 10 kΩ. To the damping resistor 22, a terminating circuit 25 including a pair of diodes 23 and 24 is connected in parallel. The diodes 23 and 24 are connected to have polarities opposite to each other. While the diodes 23 and 24 are connected to each other at their cathode in this embodiment, they may be connected at their anodes.

Figure 11:
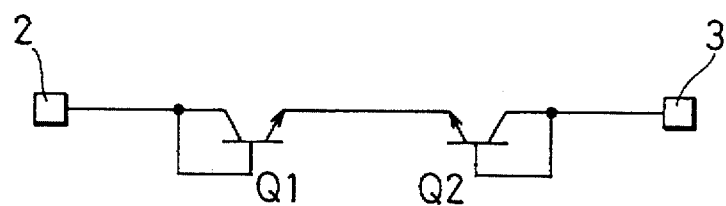
FIG. 11 is a circuit diagram showing the arrangement of a relevant portion of the fifth embodiment of the present invention.

While a PN-junction of the diodes 23 and 24 is used as the terminating circuit 25 in this embodiment, for example a base-emitter PN-junction of transistors Q1 and. Q2 may be used as shown in FIG. 11.

Figure 5:
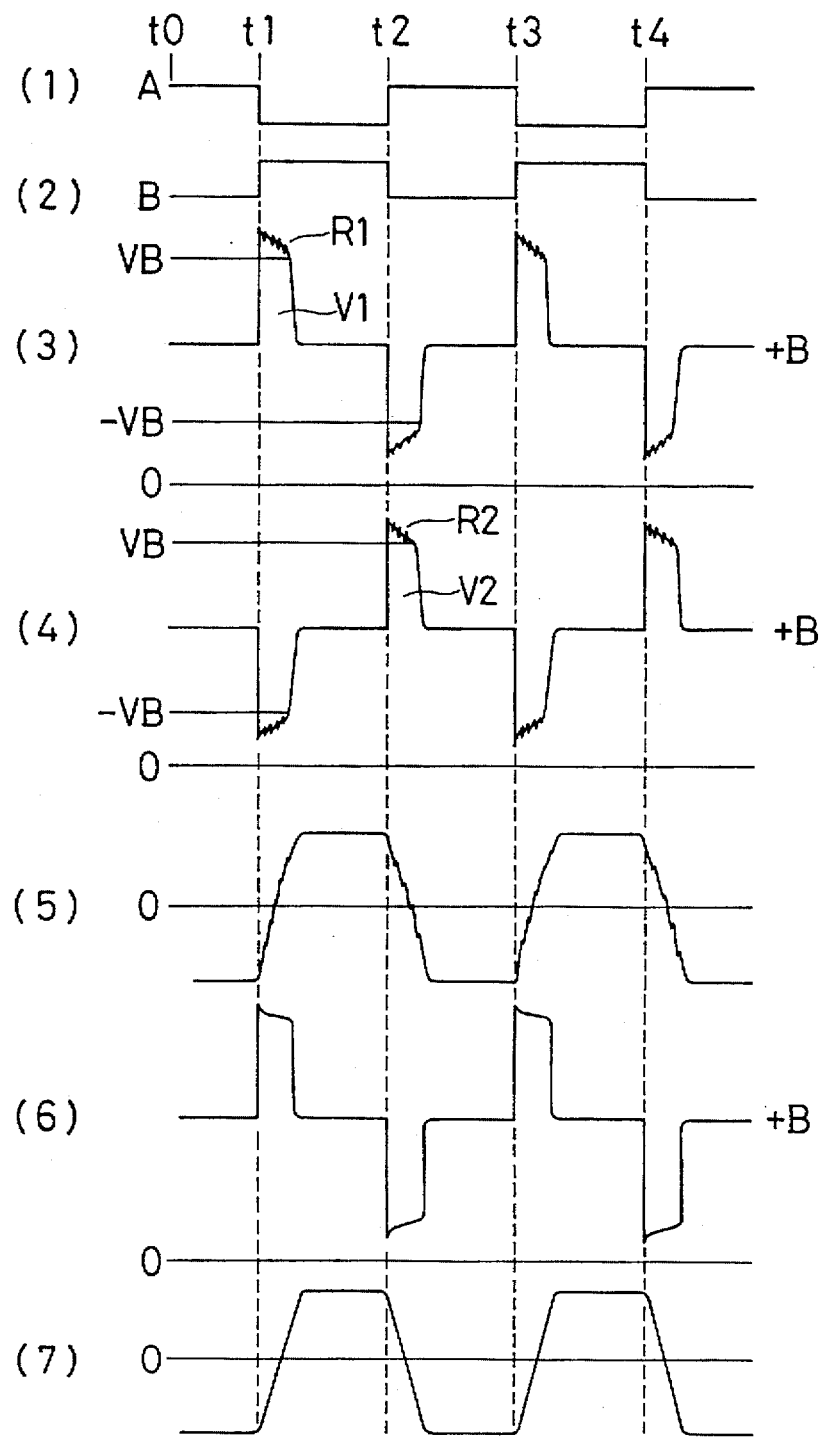
FIGS. 5 (1)–(7) show waveform charts of assistance in explaining an operation of the magnetically recording apparatus of an embodiment of the present invention.

FIG. 5 shows waveform charts of assistance in explaining an operation of the magnetically recording apparatus of the embodiment of the present invention.

At (1) of FIG. 5, a write signal A is shown which is supplied to the base of the transistor 15 through the gate 18a. The write signal A is inverted at the gate 18b to obtain a write signal B shown at (2) of FIG. 5. The write signal B is supplied to the base of the transistor 16.

For example, at a time t0, the level of the write signal A is high and the level of the write signal B is low, so that the first transistor 15 is maintained activated and the second transistor 16 is maintained disabled. Consequently, a writing current flowing in the direction of arrow a (see FIG. 4) flows to the magnetic head 11.

At a time t1, the level of the write signal A is changed from high to low and the level of the write signal B is changed from low to high, so that the state of the first transistor 15 is changed from activated state to disabled state and the state of the second transistor 16 is changed from disabled state to activated state.

At this time, if the terminating circuit 25 is not provided, the potential of the terminal 12 is as shown at (3) of FIG. 5 as described in the description of the prior art.

Specifically, the current flowing in the direction of arrow a at the magnetic head 11 flows in the direction of arrow b at the time t1, so that as shown at (3) of FIG. 5, the potential of the terminal 12 is maintained substantially constant after a so-called counter electromotive force V1 is instantaneously generated. At this time, an oscillation caused at the rises of waveforms due to transient phenomena of the counter electromotive force V1, i.e. a ringing R1 occurs.

At a time t2, the level of the write signal A is changed from low to high and the level of the write signal B is changed from high to low, so that the state of the second transistor 16 is changed from activated state to disabled state and the state of the first transistor 15 is changed from disabled state to activated state. At this time, the current flowing in the direction of arrow b at the magnetic head 11 flows in the direction of arrow a, so that as shown at (4) of FIG. 5, the potential of the terminal 13 is maintained substantially at a constant potential after a counter electromotive force V2 is instantaneously generated in a direction opposite to the counter electromotive force V1. In this case, a ringing R2 occurs like the case of the generation of the counter electromotive force.

Thus, to the magnetic head 11, a writing current affected by the ringing is supplied as shown at (5) of FIG. 5.

Subsequently, an operation performed when the terminating circuit 25 is provided will be described.

Figure 6:
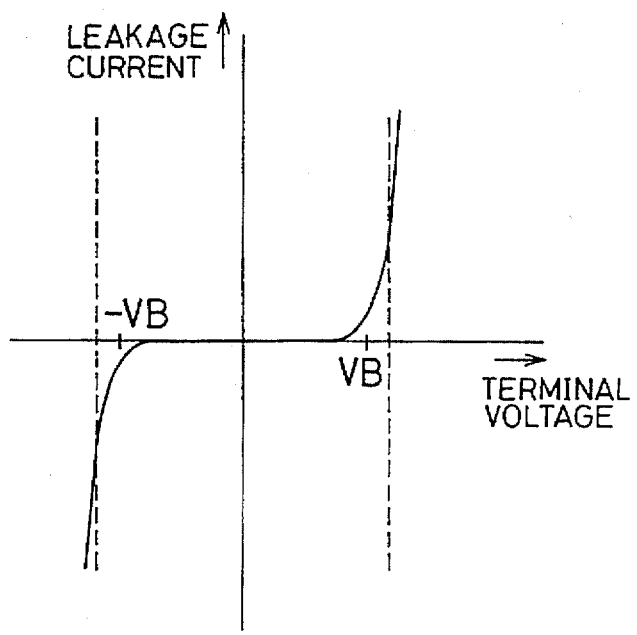
FIG. 6 is a graph of assistance in explaining an operation of a terminating circuit.

FIG. 6 graphically shows a relationship between a voltage generated between the terminals 12 and 13 in writing (hereinafter, this voltage will be referred to as terminal voltage) and a leakage current flowing through the terminating circuit 25.

As is apparent from the figure, when the terminal voltage is lower than a breakdown voltage Vb of the diodes 23 and 24, the leakage current does not flow to the terminating circuit 25 but slightly flows only through the damping resistor 22 having a low resistance. When the terminal voltage is equal to or higher than the breakdown voltage Vb of the diodes 23 and 24, either the diode 23 or 24 breaks down, so that most of the leakage current flows to the terminating circuit 25. Strictly speaking, it is when the terminal voltage is higher than the break down voltage Vb by a value corresponding to a forward voltage Vf of the diodes 23 and 24 that the diode 23 or 24 breaks down to operate the terminating circuit 25. That is, it is when a voltage Vb+Vf or higher is applied between the terminals 12 and 13.

As shown by the following expression (1), the sum of the break down voltage Vb and the forward voltage Vf will hereinafter be referred to as an operation voltage VB:

$$VB=Vb+Vf \quad (1)$$

At this time, if the operation voltage VB is set at a level slightly lower than the counter electromotive force generated in writing (see (3) and (4) of FIG. 5), while the counter electromotive force is being generated, either the diode 23 or 24 breaks down, so that most of the leakage current flows to the terminating current 25. Thus, when the terminating circuit 25 is provided, the ringing is removed in the waveforms of the voltages of the terminals 12 and 13 in writing as shown at (6) of FIG. 5 and from the writing current, the influence of the ringing is removed as shown at (7) of FIG. 5.

Since the counter electromotive force is instantaneously generated, the terminal voltage immediately decreases to be lower than the operation voltage VB so that no breakdown occurs. Consequently, the terminating circuit 25 again has a high resistance, so that the leakage current starts to flow through the damping resistor 22. Consequently, the amount of the leakage current decreases, so that the switching of the current is not delayed. As a result, the writing characteristic does not deteriorate.

Thus, since the terminating circuit 25 is provided in addition to the damping resistor 20, when the terminal voltage is lower than the operation voltage VB, the undesired leakage current is absorbed by the damping resistor 20. Under this condition, since the resistance of the damping resistor 20 is comparatively high, characteristics such as the current switching characteristic do not deteriorate.

On the other hand, when a counter electromotive force is generated, the terminal voltage is equal to or higher than the operation voltage VB, so that the leakage current flows to the terminating circuit 25 to remove the ringing. Further, since the terminal voltage immediately decreases to be lower than the operation voltage VB, the terminating circuit 25 again has a high resistance, so that the switching of the current is not delayed. Consequently, the writing characteristic does not deteriorate.

While the damping resistor 22 and the terminating circuit 25 are provided in parallel in this embodiment, only the terminating circuit 25 may be provided without the damping resistor 22 being provided.

Figure 7:
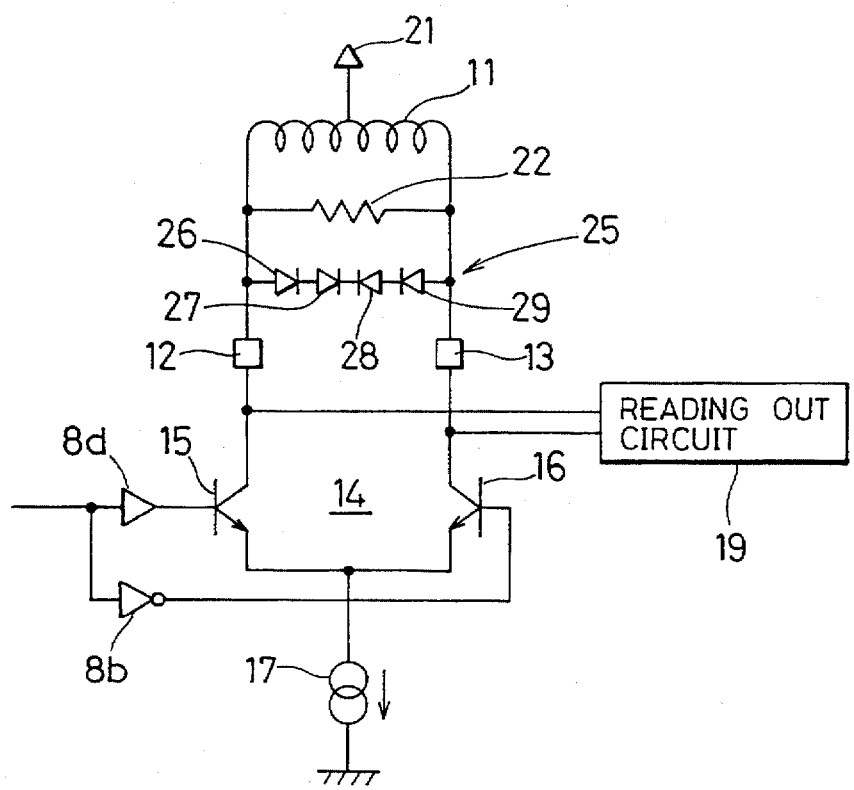
FIG. 7 is a circuit diagram showing the arrangement of a second embodiment of the present invention.
Figure 8:
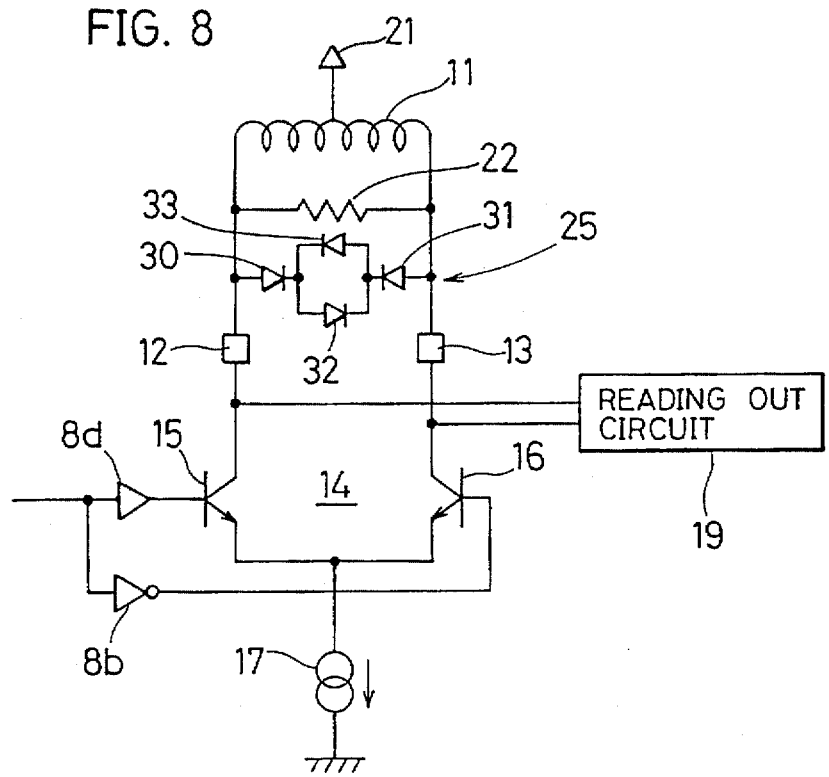
FIG. 8 is a circuit diagram showing the arrangement of a third embodiment of the present invention.

While the terminating circuit 25 includes two diodes 23 and 24 in this embodiment, it may includes four diodes 26, 27, 28 and 29 as shown in FIG. 7 so that the two diodes 26 and 27 connected to have the same polarity and the two diodes 28 and 29 connected to have the same polarity are arranged to have polarities opposite to each other. Further, as shown in FIG. 8, diodes 32 and 33 connected in parallel to have polarities opposite to each other may be connected between diodes 30 and 31 connected in series to have polarities opposite to each other.

Figure 9:
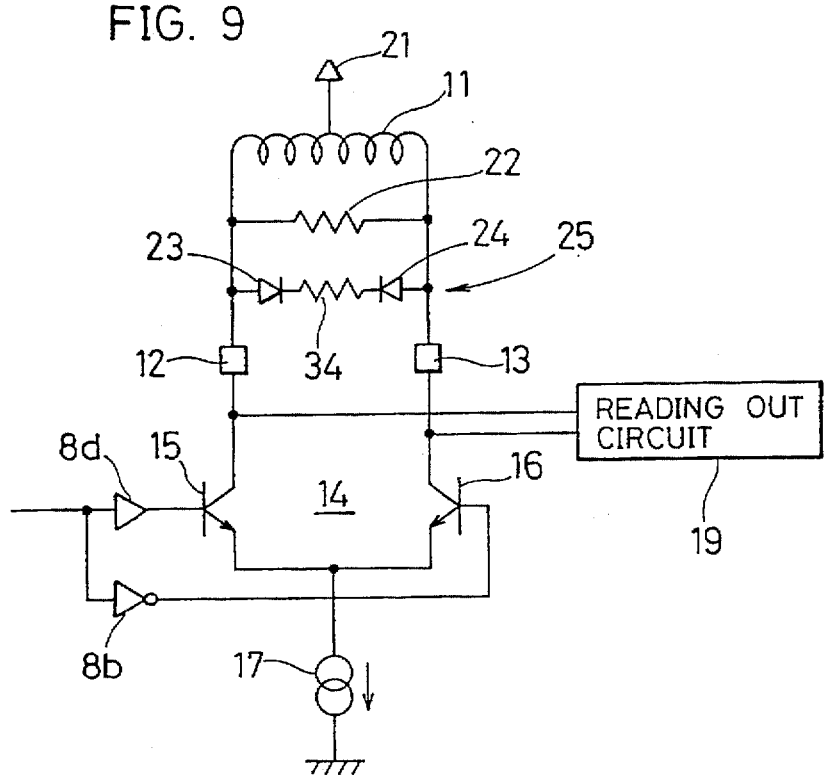
FIG. 9 is a circuit diagram showing the arrangement of a fourth embodiment of the present invention.

Further, as shown in FIG. 9, a resistor 34 may be provided between the diodes 23 and 24. When such a resistor 34 is provided, the amount of the leakage current can be adjusted by setting the resistance of the resistor 34 to an arbitrary value, so that the amount of the leakage current can be set to an optimal value according to the magnetic head used. A similar advantage is obtained when a capacitor is provided instead of the resistor 34.

Figure 10:
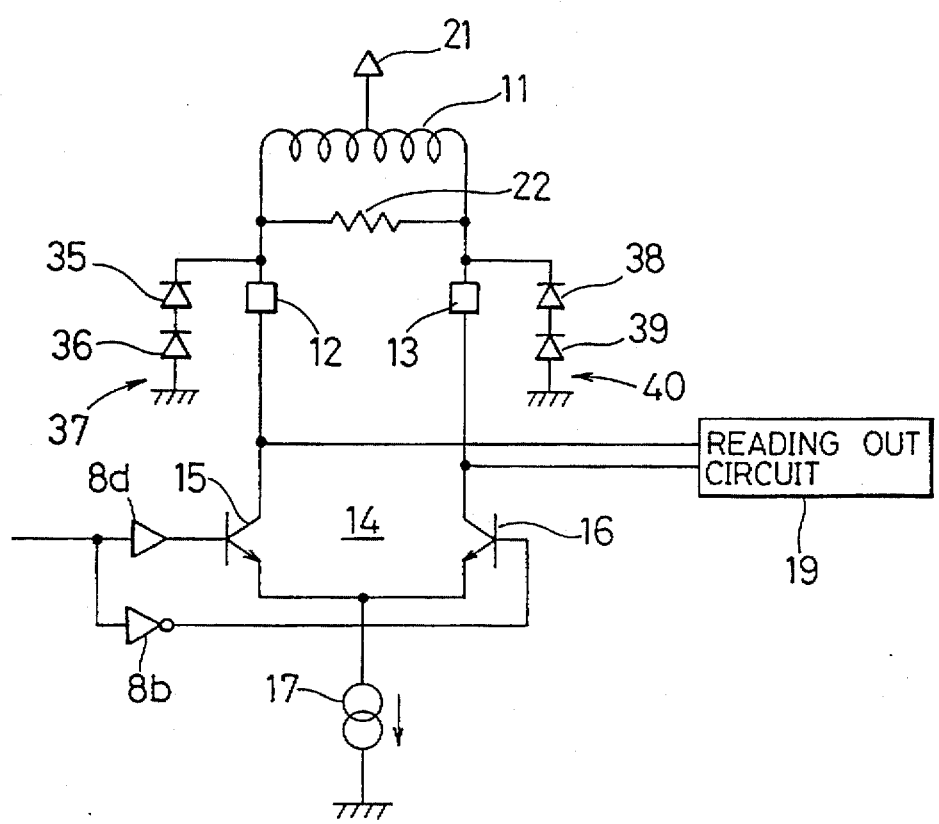
FIG. 10 is a circuit diagram showing the arrangement of a fifth embodiment of the present invention.

Further, as shown in FIG. 10, a diode group 37 including two diodes 35 and 36 connected to have the same polarity and a diode group 40 including two diodes 38 and 39 connected to have the same polarity may be provided so that the cathode side of the diode group 37 is connected to the terminal 12 and the anode side thereof is connected to ground and that the cathode of the diode group 40 is connected to the terminal 13 and the anode side thereof is connected to ground.

Figure 12:
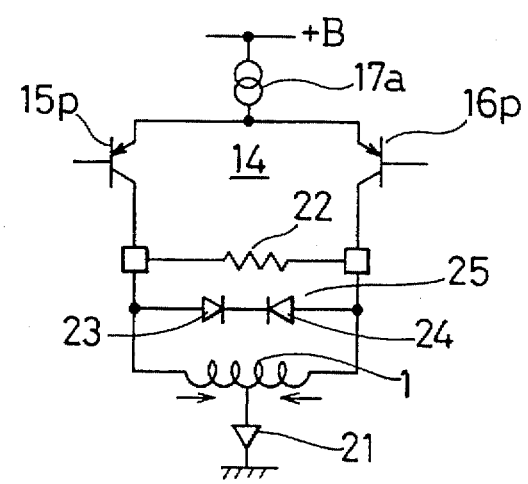
FIG. 12 is a circuit diagram showing the arrangement of a sixth embodiment of the present invention.
Figure 13:
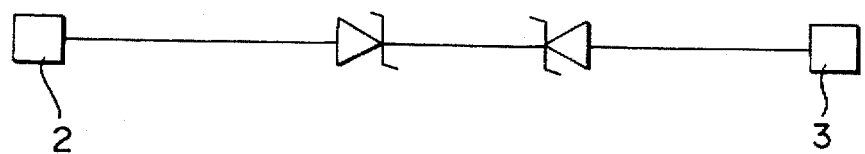
FIG. 13 is a circuit diagram showing an arrangement of the present invention using Zener diodes.

While the terminating circuit 25 includes one to four diodes in the above-described embodiment, it may includes more number of diodes. Moreover, the terminating circuit 25 may include Zener diodes (see FIG. 13). Further, the differential circuit 14 may include PNP transistors 15p and 16p as shown in FIG. 12. In this case, a constant current source 17a is connected to the supply voltage +B and the midpoint of the magnetic head 1 is connected to ground through the terminal 21.

As described above, according to the present invention, the resistance of the terminating circuit is maintained high if the potential difference across the magnetic head is equal to or lower than a voltage at which the PN-junction breaks down, so that the deterioration of the reading and writing characteristics is prevented.

On the other hand, the terminating circuit has a low resistance if the PN-junction breaks down due to a drastic counter electromotive force generated at the time of switching of the writing current, so that the ringing due to the counter electromotive force is removed.

Obviously, many modifications and variations of the present invention are possible in light of the above teachings. It is therefore to be understood that within the scope of the appended claims, the invention may be practiced other than as specifically described.

What is claimed is:

1. A magnetically recording apparatus comprising:

means for connecting a center of a magnetic head to a constant potential;

differential connected transistors having output electrodes and having control electrodes supplied with a writing signal;

means for connecting said output electrodes of the differential connected transistors across the magnetic head;

first resistor connected across the magnetic head for damping said writing signal;

a terminating circuit connected in parallel to the first resistor, said terminating circuit including a pair of PN-junctions having polarities opposite to each other; and a second resistor connected between the pair of PN-junctions, wherein said terminating circuit is activated when a voltage difference across the magnetic head becomes a predetermined level or above at a time of writing and current flows across the pair of PN-junctions when said terminating circuit is activated.

2. A magnetically recording apparatus according to claim 1, wherein said PN-junctions are diodes.

* * * * *